United States Patent [19]

Cormia et al.

[11] 4,013,532
[45] Mar. 22, 1977

[54] METHOD FOR COATING A SUBSTRATE

[75] Inventors: Robert L. Cormia, Oakland; Kazumi N. Tsujimoto, El Cerrito; Sigurd Andresen, Redwood City, all of Calif.

[73] Assignee: Airco, Inc., Montvale, N.J.

[22] Filed: Mar. 3, 1975

[21] Appl. No.: 554,823

[52] U.S. Cl. .................. 204/192 C; 204/164; 204/165; 204/170; 204/298; 250/531; 427/41
[51] Int. Cl.² .................................. C23C 15/00
[58] Field of Search .......... 204/164, 165, 168, 170, 204/192, 298; 250/531; 427/39, 41

[56] References Cited

UNITED STATES PATENTS

| | | |
|---|---|---|
| 3,297,465 | 1/1967 | Connell et al. .................. 427/39 |
| 3,464,907 | 9/1969 | Froemel et al. .................. 204/192 |
| 3,471,316 | 10/1969 | Manuel .................. 204/165 X |
| 3,475,307 | 10/1969 | Knox et al. .................. 204/168 |
| 3,666,533 | 5/1972 | Lee .................. 427/41 |
| 3,878,085 | 4/1975 | Corbani .................. 204/298 |

*Primary Examiner*—John H. Mack
*Assistant Examiner*—Aaron Weisstuch
*Attorney, Agent, or Firm*—David A. Draegert; Edmund W. Bopp

[57] ABSTRACT

A method and apparatus for coating a substrate with a layer of polymerized material by simultaneous glow discharge polymerization and sputtering is disclosed. A substrate and two electrodes are placed in a chamber which can be evacuated. An appropriate pressure of a gas which can form a polymer is introduced into the chamber. A glow discharge is established in the gas. Molecules of starting gas and reactive species created in the glow discharge deposit on the electrodes and on the substrate. Material deposited on at least one of the electrodes is sputtered onto the substrate by applying an electric potential, preferably an AC potential, across the electrodes. The glow discharge is preferably confined to a region adjacent to the sputtered electrode. This confinement may be accomplished by the use of a planar magnetron sputtering cathode. The method and apparatus disclosed allow the rapid deposition of high quality polymeric coatings at low gas pressures.

13 Claims, 5 Drawing Figures

METHOD FOR COATING A SUBSTRATE

BACKGROUND OF THE INVENTION

1. Field of the Invention

This invention relates to a method and apparatus for coating a substrate with a layer of polymerized material by simultaneous glow discharge polymerization and sputtering.

2. Description of the Prior Art

Glow discharge polymerization is a well-known technique for preparing a layer of organic or inorganic polymer. There are two basic types of processes. In the first type, the surface of an existing material is polymerized and "cured" by exposing it to a glow discharge which is created in air or inert gas. Surface molecules are activated by the glow discharge and form links and cross links with adjacent molecules. Because the activation is confined to a region near the surface, the bulk of the material is unaltered. In the second type of process, a layer of polymerized material is deposited on a substrate by operating a glow discharge in a monomeric gas adjacent to the substrate. Reactive species created in the glow discharge deposit on the substrate and form a polymerized layer. The polymerization extends throughout the deposited material. This invention is related to the second type of polymerization process.

In a typical polymerization situation of the second type, the glow discharge is established by applying an electric potential across two electrodes provided in a chamber containing a monomeric gas at a pressure less than atmospheric pressure. There is no glow and only a minute current flows through the gas unless the interelectrode potential exceeds a threshold value which is sufficient to ionize or "break down" the gas.

As is well known, this breakdown potential depends upon the composition of the gas, the system pressure and the distance between the electrodes. After breakdown has occurred, the gas is conductive and a stable plasma can be maintained over a wide range of currents. An established plasma can be maintained with a potential lower than the breakdown potential. The exact composition of the discharge plasma is not known. It is believed to consist of electrons, ions, free radicals and other reactive species.

Several other methods of establishing a glow discharge in a gas are known. One of these which has been used to deposit polymerized material involves producing a radio frequency current in a coil which encircles a chamber containing the gas. If the current is sufficiently high, the gas will ionize and a plasma can be maintained.

However the glow discharge is established, the reactive species created by it will deposit on any nearby surface. Unreacted monomers will also deposit. This simultaneous deposition allows the formation of a polymerized layer which has uniform properties. Surface bombardment by ions, electrons or electromagnetic radiation originating in the plasma may impart additional molecular cross linkages to the deposited layer.

The reactive species are formed in collisions between monomeric molecules and electrons or ions. Thus, the rate of polymerization can be increased by increasing the discharge current. However, as the current is increased, the potential must be increased and the probability of arcing is greatly increased. Arcing is to be avoided because it may destroy or otherwise degrade the polymeric layer and possibly the power supply.

The material deposition rate is directly related to the pressure of the monomeric gas. An increase in this pressure increases the rate of deposition of the monomer and the rates of formation and deposition of the reactive species. Conventional glow discharge polymerization can be accomplished at commercially reasonable rates only by operating at pressures greater than about 100 millitorr (mT). Such a high pressure is a distinct disadvantage when it is desired to perform several vacuum processes simultaneously or sequentially in the same chamber, because many vacuum processes require pressure of less than 50 mT.

It is also known to increase the deposition rate by magnetically concentrating the plasma and directing it toward the substrate. Such a method for depositing polystyrene is described in U.S. Pat. No. 3,297,465. If the substrate is a conductor, it can be made an accelerating electrode. If the substrate is an insulator, the substrate can be placed behind a perforated electrode through which the reactive species can pass. Such a method for forming a layer of polystyrene is described in U.S. Pat. No. 3,318,790. The disadvantage in directing the plasma toward the substrate is that bombardment by ions and electrons tends to increase the temperature of the coating and the substrate. Overheating of the polymeric film is undesirable because its physical and chemical properties tend to become nonuniform. Further, excessive cross linkages may form which will result in a brittle film. Excessive heating may also disassociate or otherwise degrade the substrate.

Sputtering is also a well-known technique for forming a layer of material on a substrate. In sputtering, material is removed from the surface of a target by ionic bombardment and deposited on the substrate. When the material to be sputtered is an electrical conductor, a dc potential is used. When the material to be sputtered is an insulator, it is preferred to use an rf potential in order to eliminate the build-up of surface charges on the insulator and the resulting loss in accelerating potential.

In the conventional process for depositing a layer of a polymer by sputtering, the polymer itself is first prepared in the form of a sheet or powder. A target is fabricated by placing the sheet or powder in contact with a conductive surface. The target and a second electrode are placed in a chamber which can be filled with an appropriate pressure of an ionizable inert gas such as argon. A polymeric coating on a substrate can be formed by establishing a glow discharge by applying a suitable potential between the target and the second electrode. Such a process for depositing Teflon polytetrafluoroethylene (PTFE) is described in U.S. Pat. No. 3,767,559.

It is also known to deposit a layer of a chemical compound by reactive sputtering in which one constituent is sputtered in the presence of a gas of another. For example, a layer of metal oxide is deposited by sputtering the metal in a chamber containing oxygen.

Sputtering is generally considered to be a slow process. The deposition rate can be increased by increasing the current and the gas pressure but with the same limitations mentioned above for glow discharge polymerization. Further, if the pressure is increased too much, the deposition rate begins to decrease because sputtered atoms are scattered in collisions with the gas before they reach the substrate.

The sputtering rate can be greatly increased by confining the plasma to a region adjacent to the target.

Such confinement intensifies the plasma and increases both the probability of gas atom-electron collisions and the probability that the ions thus formed will strike the cathode. By use of a magnetic field, the plasma can be confined to a region which is only slightly separated from the cathode. One such device is the planar magnetron sputtering cathode which is described in U.S. patent application Ser. No. 532,807, now abandoned Dec. 16, 1974 by R. L. Shrader and K. N. Tsujimoto.

SUMMARY OF THE INVENTION

The present invention concerns a method and apparatus for producing a layer of polymer on a substrate by simultaneous glow discharge polymerization and sputtering. This process allows the rapid deposition of high quality polymeric coatings at low gas pressures.

To practice the method of the invention, a substrate and first and second electrodes are placed in a chamber which can be evacuated. The substrate is preferably located between the electrodes and parallel to at least the first electrode. The second step is to provide an appropriate pressure of a starting gas in the space between the electrodes. The starting gas can be a monomer or any gas from which a polymer can be formed. The starting gas can be mixed with an ionizable inert gas. The third step is to establish a glow discharge in the gas. This step is preferably accomplished by applying a potential of several hundred volts across the electrodes. It is also preferred to confine the glow discharge plasma in a region adjacent to at least the first of the electrodes. This confinement is preferably accomplished by providing lines of magnetic flux which emerge from the electrode, arc into the space adjacent to the electrode, and re-enter the electrode. Molecules of starting gas and reactive species created in the glow discharge deposit on the electrodes and on the substrate. The fourth step is to apply an electric potential, preferably an ac potential, across the electrodes. Material which was deposited on the first electrode is sputtered when that electrode is negative with respect to the second electrode. A portion of the sputtered material deposits on the substrate where a polymerized coating forms. In a preferred embodiment the third and fourth steps are combined in that a single electrical potential is applied across the first and second electrodes to both establish a glow discharge and to sputter material from the first electrode.

If both sides of the substrate are to be coated, the glow discharge plasma is preferably confined adjacent to both electrodes and each electrode is sputtered alternately. If only one side of the substrate is to be coated, the glow discharge plasma need only be concentrated adjacent to the first electrode and the size, shape and location of the second electrode can be varied within wide limits.

One object of the present invention is to form a layer of polymeric material on the substrate at a high rate but at a low gas pressure. This is accomplished by concentrating and confining the plasma in a region adjacent to one or both electrodes. Thus it is possible to simultaneously perform the method of this invention and other vacuum processes, such as electron beam evaporation, in the same chamber without serious cross contamination. Further, confinement of the plasma to regions adjacent to the electrodes reduces undesirable heating of the polymeric coating or substrate.

A second object is to form a polymeric layer without the need for an electrical connection to the substrate. This is advantageous because coating of insulating the semi-conducting substrates is thus as simple as coating conductors. Further, a moving substrate can be coated without complicated means to maintain electrical contact with it.

A third object is to form a layer of polymeric material on a substrate without first preparing a sputtering target from a powder or sheet of that material.

A fourth object is to allow the formation of a layer of polymeric material which, if desired, is uniformly doped with material sputtered from the target.

DESCRIPTION OF THE PREFERRED EMBODIMENTS

Figure 1:
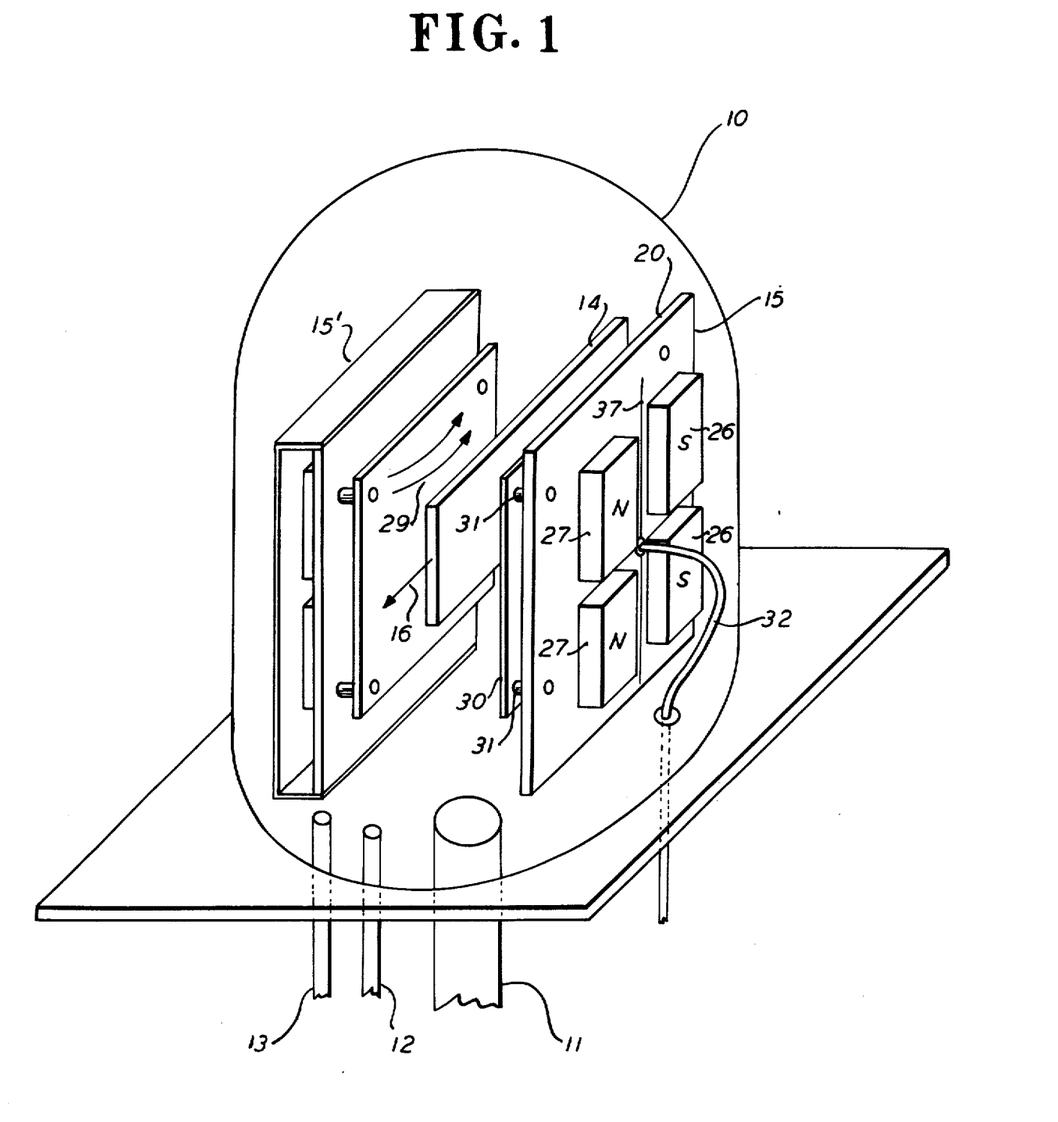
FIG. 1 is a perspective drawing of an apparatus suitable for coating both sides of a substrate by the method of this invention.

One apparatus suitable for practicing the method of this invention is shown in FIG. 1. A generally enclosed chamber 10 is provided with a first conduit 11 for connection to a suitable vacuum pumping means (not shown). The desired pressure of starting gas can be maintained in the chamber by introducing gas at a controlled rate from a source (not shown) through a second conduit 12. When it is desired to polymerize an organic monomer such as styrene, a convenient source is obtained by containing the liquid monomer in an enclosed vessel and regulating the flow of its vapor into the chamber by a metering valve. If desired, an inert ionizable gas can also be introduced into the chamber at a controlled rate through a third conduit 13.

The substrate 14 which is to be coated is supported (by means not shown) in a position adjacent to at least one electrode assembly. FIG. 1 illustrates two similar electrode assemblies, 15 and 15' which are used when it is desired to coat both sides of the substrate. If it is desired to coat only one side of the substrate, the electrode assembly 15' can be replaced by a simple plate or bar which can be placed alongside the electrode assembly 15.

The electrode assembly 15 includes a mounting plate 20 which is preferably made of a non-magnetic material, such as aluminum or stainless steel. The electrode itself 30 is a flat sheet and normally consists of a non-magnetic material which has a low sputtering yield, such as aluminum. The electrode need not be planar, but a planar surface is preferred because of its ease of manufacture. The sheet may be perforated to allow passage of starting gas molecules, however, this is not necessary. The electrode is positioned parallel to the mounting plate and separated from it by a number of stand-off insulators such as 31. The separation distance between the electrode sheet 30 and the mounting plate 20 is such that the mounting plate is dark-space shield which, as is well known in the art, prevents a glow discharge from forming adjacent to the side of the electrode which is toward the mounting plate.

Electrical connection between the electrode and one side of a power supply (not shown) is provided by a cable 32 which may be a shielded cable. The center conductor of the shielded cable is connected to the electrode 30 and the grounded shield is connected to the mounting plate 20.

A number of magnets, such as 26 and 27, are mounted to the side of the mounting plate 20 which is opposite to the electrode. The magnets are preferably mounted in a manner which produces lines of magnetic flux which pass through the mounting plate and electrode, arc into the space between the electrode and the substrate and then repass through the electrode and the mounting plate. There are a variety of arrangements of magnets which will accomplish this. The arrangement illustrated in FIG. 1 uses a particular type of permanent magnet which has the shape of a rectangular solid. The two poles of the magnet lie just under the surfaces of the two largest faces of the magnet. The magnets are mounted along a line 37 on the mounting plate. The magnets are positioned in pairs such that one magnet, such as 26, has its north face next to the mounting plate 20, and the other, such as 27, has its south face next to the mounting plate. When so mounted, lines of magnetic flux, such as 29, pass from one magnet through the mounting plate and electrode, arc into the region between the electrode and the substrate, and repass through the electrode and mounting plate to the other magnet. Thus there is a "tunnel" of magnetic flux lines which extends along the surface of the electrode parallel to the line 37 between the magnets 26 and 27. When a glow discharge is established, the combined electric and magnetic fields concentrate and confine the glowing plasma to a region between the electrode and the substrate. The glow is separated from the electrode by a few millimeters and extends parallel to the line 37. The length of the linear glow discharge region can be easily extended by extending the electrode and placing additional pairs of magnets along the line 37.

In coating a substrate with the apparatus of FIG. 1, the chamber is first evacuated to a pressure which is approximately 1% of the desired operating pressure. This is a conventional step for minimizing the effects of residual gases. Next, a suitable starting gas, such as an organic or inorganic monomer, is introduced into the chamber at a rate sufficient to maintain the desired operating pressure. Polystyrene layers have been formed at high rates from an essentially pure styrene gas. Sufficient ions were formed from the styrene to properly sputter material deposited on the electrodes. However, if desired, an ionizable inert gas, such as argon or nitrogen, may also be introduced into the chamber. The deposition rate depends upon the partial pressure of the starting gas, but the magnitude of the total pressure is not critical as long as it is sufficient to maintain a glow discharge. For styrene alone or styrene mixed with argon or nitrogen the lowest pressure at which the gas could be ionized was typically about 5 mT.

The next step is to establish a glow discharge. Preferably, this step is accomplished by applying an electric potential of several hundred volts across the electrodes. Once the glow discharge is established, the discharge current is adjusted to maintain the desired deposition rate.

A dc potential can be used to deposit a polymerized layer. In this case, only one electrode, the cathode, is sputtered, and material is deposited at a much higher rate on the side of the substrate facing the cathode than on the opposite side. However, as will be described below, a film of material also builds up on certain areas of the electrode. When working with polymers, this deposited material is usually an insulator and a severe arcing problem arises when a dc or a low frequency, such as 60 Hz, alternating potential is used. The arcing probably results because ionic bombardment of the electrode builds up a potential across the thin film which eventually exceeds the dielectric breakdown strength of the film. The arcing problem is practically eliminated by operating with an arc potential of a frequency sufficiently high to periodically discharge, probably by electron bombardment, the exposed surface of the film before the breakdown potential is reached. This problem and solution are more completely described in the copending U.S. application Ser. No. 540,044, filed Jan. 10, 1975 by R. L. Cormia, T. A. Trumbly and S. Andresen.

An ac potential is, therefore, preferred in the method of this invention. The exact operating frequency is not critical and satisfactory results have been obtained with 3.5 kHz. A frequency as low as a few hundred Hz would probably still be adequate to prevent arcing. A frequency greater than about 60 kHz would probably require the added complexity of an impedance matching network. An ac potential is preferred even when only one side of the substrate is to be coated.

When the substrate is placed nearby an electrode assembly such as 15, the lines of magnetic flux extending from the electrode confine the glow discharge plasma to a region adjacent to the electrode. In this plasma region, collisions between starting gas molecules and electrons or ions create reactive species, such as ions and free radicals. These reactive species, as well as molecules of the starting gas, deposit upon both the electrode and the substrate. Gas ions which escape from the plasma region accelerate toward the electrode when it is at a negative potential. The ion impact dislodges material deposited on the electrode and a portion of the sputtered material deposits on the substrate. The reactive species and unreacted molecules of starting gas deposited on the substrate form a layer of uniformly polymerized material.

In order to maximize the substrate deposition rate, the substrate is preferably positioned parallel to the electrode at a separation distance which is slightly greater than the extent of the glowing plasma region. When the substrate is positioned approximately midway between two electrode assemblies such as 15 and 15' and an ac potential is applied, the electrodes are alternately sputtered and both sides of the substrate are coated at approximately the same rate.

The rate of deposition on the substrate is spatially non-uniform. The deposition rate is highest on regions of the substrate which are closest to the plasma region. If the substrate is narrower than the length of the glow discharge region, a uniform thickness can be deposited by moving the substrate in a direction perpendicular to the length of the glowing region. In FIG. 1, the glow discharge extends vertically parallel to the line 37 and the substrate is translated horizontally in the direction of the arrow 16. If desired, the substrate may pass through the coating region several times.

The rates of material deposition and ionic bombardment of the electrode 15 are also spatially non-uniform. The area of the electrode which is in alignment with the glow discharge region is kept free of deposited material by the sputtering process. However, a build-up of material occurs on other areas of the electrode where the rate of deposition exceeds the rate of removal of sputtering. As discussed above, this buildup can lead to undesirable arcing.

Normally there is no observable erosion of the electrode surface because the sputtering rate of the electrode material itself is normally much lower than that of the material deposited on the electrode. The deposited material is much more weakly bound to the electrode than the actual electrode material. Hence, the rate of removal of the deposited material probably remains high even for very low energy ions which have insufficient energy to remove tightly bound atoms. Thus, it may be possible to sputter the deposited material with an inter-electric potential which is insufficient to establish or maintain the glow discharge. In such a case, the discharge could be established or maintained by use of other means, such as a third electrode as used in triode sputtering.

Figure 2:
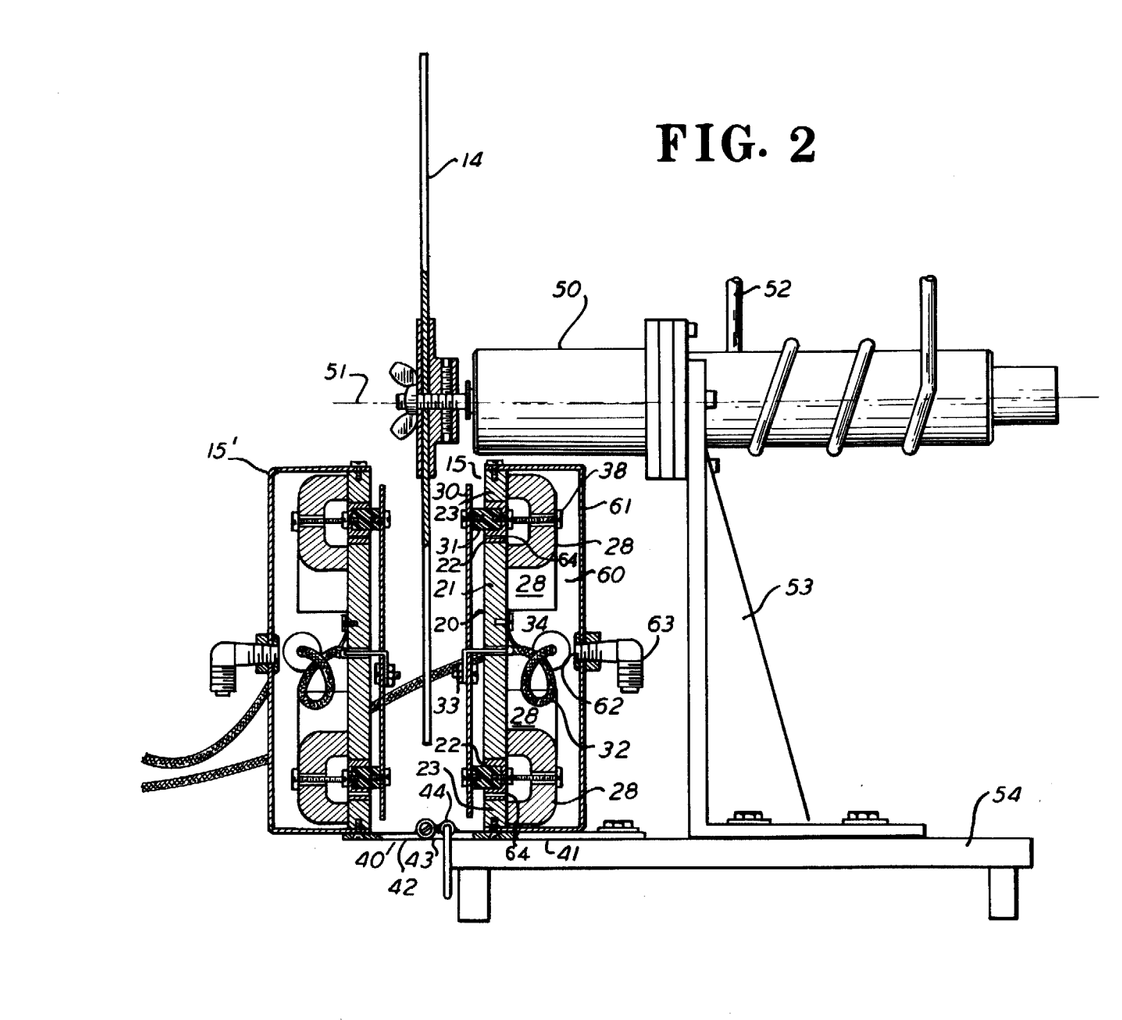
FIG. 2 is a cross-sectional view of an apparatus for coating both sides of a rotating disc by the method of this invention.

Another apparatus suitable for coating a moving substrate by the method of this invention is illustrated in FIG. 2. The substrate 14 is a circular disc which can be rotated about its axis 51 by a hermetically sealed motor 50. The motor can be cooled by circulating fluid through the cooling coil 52. The motor is mounted by a bracket 53 to the base 54. One electrode assembly 15 is mounted to one leaf 41 of a hinge 40 which in turn is mounted on the base 54. The other electrode assembly 15' is mounted to the other leaf 42 of the hinge. When thus mounted, the electrode assembly 15' can be rotated about the hinge pin 43 and can thus be moved out of the way to permit convenient mounting and removal of the substrate 13. The hinge can be fixed in any desired position by means of the lock 44.

The starting gas from a source (not shown) flows through the fitting 63 to the port 62 and into an enclosure 60 which is formed by the mounting plate 20 and a cover plate 61. The mounting plate has one or more openings, such as 64, to allow the starting gas to be introduced directly into the plasma region between the electrodes. When the starting gas is directly introduced into the plasma region, the average pressure in the chamber can be reduced. Further, the diameter and location of the openings can be adjusted so that a gradient in starting gas concentration can compensate for the increased area of the disc near its perimeter and thus help to maintain a uniform thickness along a radius of the disc.

In the apparatus of FIG. 2, each electrode 30 is an 11 × 15 cm (4.5 × 6 in.) sheet of perforated aluminum which is separated from the mounting plate 20 by about 6 mm (¼ in.). The separation between the electrodes is about 4 cm (1.6 in.). Electrical contact between the center conductor of a shielded cable 32 and the electrode 30 is made by a fastener 33. Electrical contact between the shield of the cable 32 and the mounting plate 20 is made by fastener 34.

The mounting plate 20 is composed of three nested sections similar to those described in the Shrader and Tsujimoto application cited above. The innermost section is an inner pole piece 21. The inner pole piece is surrounded by an annular intermediate section 22 which is formed from a non-magnetic material such as stainless steel. The intermediate section 22 is surrounded by the annular outer pole piece 23. The pole pieces 21 and 23 are formed from a magnetic material, such as cold rolled steel. The perimeters of the pole pieces are generally rectangular with rounded corners. The pole pieces could be circular, triangular or some other desired shape. The purpose of the separate pole pieces 21 and 23 is to reduce the variations in the magnetic field strength and provide a more uniformly intense glow discharge. This results in more uniform deposition rates along the length of the electrode. Less uniformity is required near the ends of the electrodes because they can be extended well beyond the width of the region where thickness uniformity is required.

Six U-shaped magnets, such as 28, are mounted to interconnect the inner and outer pole pieces. Only four of these magnets 28 are shown in FIG. 2. The magnets are spaced along the pole pieces and each magnet is held in place by a screw 38 which passes through the center of the magnet and threads into the intermediate section 22. Each of the magnets 28 is oriented so that its north pole contacts the inner pole piece 21 and its south pole contacts the outer pole piece 23. Alternately, all of the south poles could contact the inner pole piece. When thus mounted, lines of magnetic flux will pass from one pole piece through the mounting plate and electrode, arc into the region between the electrode and the substrate, and then repass through the electrode and mounting plate to the other pole piece. There is thus an endless "tunnel" or magnetic flux lines which extends along the surface of the planar electrode in approximate alignment with the annular region which lies between the inner and outer pole pieces. The combination of this type of magnetic field and a planar electrode is known as a "planar magnetron." (See the article by John S. Chapin in *Research/Development*, January 1974, pp 37–40.)

The combined electric and magnetic fields concentrate and confine the glow discharge plasma to an annular region which lies parallel to the electrode along the "tunnel" of magnetic flux. Confinement of the plasma to a closed ring is more efficient than confinement to a linear region as in the apparatus of FIG. 1. The latter requires additional power to replace the electrons and ions lost from the open ends of the linear confinement region. Ions which escape from the annular plasma confinement region are accelerated toward the negative electrode and may sputter material from the surface on impact. The sputtering rate is highest in an annular region which is aligned with the confined plasma.

Figure 3:
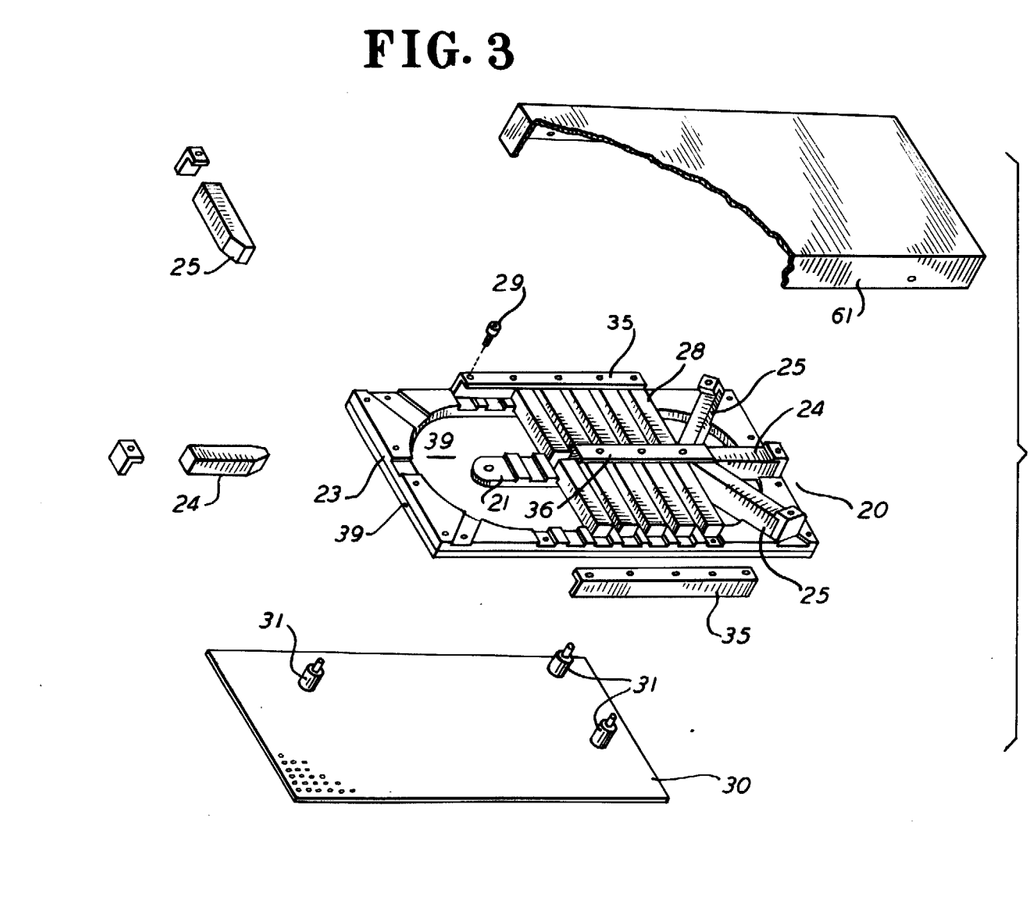
FIG. 3 is an exploded view of an electrode assembly.

Still another electrode assembly is illustrated in FIG. 3. In this device, the mounting plate 20 includes a rectangular aluminum plate to which an inner pole piece 21 and an annular outer pole piece are mounted. Fourteen bar magnets, such as 28, are mounted to interconnect the inner and outer pole pieces. Each of the magnets is mounted so that its north pole is in contact with the inner pole piece. The magnets are held in place by two side mounting brackets, such as 35, and a center mounting bracket 36. Reasonable continuity of the magnetic field strength near the ends of the mounting plate 20 is obtained by the use of two end magnets, such as 24, and four corner magnets such as 25. A portion of one end of each of the magnets 24 and 25 is removed to provide increased area of contact between these magnets and the inner pole piece.

The magnetic field intensity in the glow discharge confinement region should be in the range of 100 to 400 gauss. A field intensity of about 200 gauss was obtained in the device illustrated in FIG. 3 by use of 2.5 × 2.5 × cm (1 × 1 × 4 in.) magnets which have a magnetic field intensity of 0.9 to 1.2 kiklogauss measured near their ends. The maximum field strength measured at the surface of the electrode within the annular sputtered region was also about 200 gauss.

In the electrode assembly illustrated in FIG. 3, the aluminum electrode is approximately 24 × 52 cm (9.5 × 20 in.), and the separation between the electrode and its mounting plate is about 2 cm (0.8 in.). A higher sputtering rate was observed with a solid sheet electrode than with a perforated electrode. This indicates that sputtered material forms a significant fraction of the material which is deposited on the substrate.

Substrates have been coated using each of the electrode assemblies illustrated in FIGS. 1, 2 and 3. Data and results obtained using the electrode assembly illustrated in FIG. 3 will be used to describe the operating parameters of the process.

Figure 4:
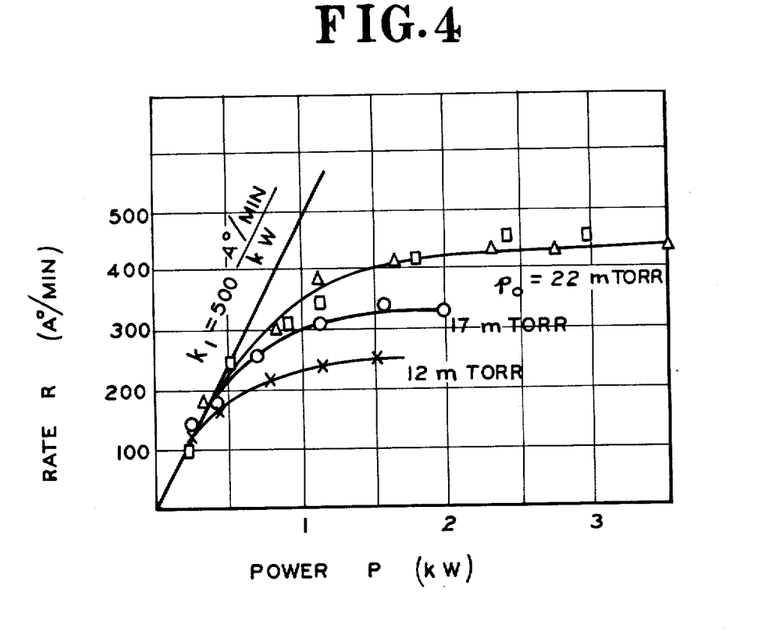
FIG. 4 is a graph showing the deposition rate as a function of power applied to an apparatus in coating a substrate by the method of this invention.

FIG. 4 illustrates the styrene deposition rate R observed as a function of the power P supplied to the glow discharge for three different flow rates of styrene. A relative indication of the flow rate is obtained from $P_o$, the partial pressure of styrene in the system in the absence of a glow discharge. The latter quantity is here referred to as the "no glow pressure." For each of the curves shown in FIG. 4, the substrate was placed midway between the electrodes which were separated by approximately 10 cm (4 in.). In each experiment, the system was evacuated to less than $10^{-4}$ torr and then nitrogen was introduced at a rate sufficient to raise the system pressure to 8 mT. Next, styrene vapor was admitted to the chamber to increase the total pressure to 20, 25 and 30 mT, respectively, in the three experiments. The no glow pressure of styrene was thus 12, 17 or 22 mt. When the flow rates and the total system pressure were stable, a glow discharge was established by applying a 10 kHz alternating potential across the electrodes. The system deposition rate was determined from the thickness of the layer deposited on glass slides introduced between the electrodes for 1 minute. In each experiment the styrene deposition rate was measured for several different powers. As the power increased, it was observed that the total system pressure decreased from the initial value to approximately 8 mT, which is the partial pressure of the nitrogen alone. The decrease in the partial pressure of styrene indicates that the amount of styrene consumed in the process increases as the power increases.

The data shown in FIG. 4 reveal two experimental constants which may be used to characterize the deposition rate of a particular material with a particular apparatus. For a low power where the partial pressure of styrene is relatively high, the deposition rate R is approximately $k_1 P$ where the constant $k_1 = 500$ (A/min)/kW. At high powers where the partial pressure of styrene is low, the deposition rate approaches a maximum value which depends upon the styrene flow rate or the no glow pressure.

Figure 5:
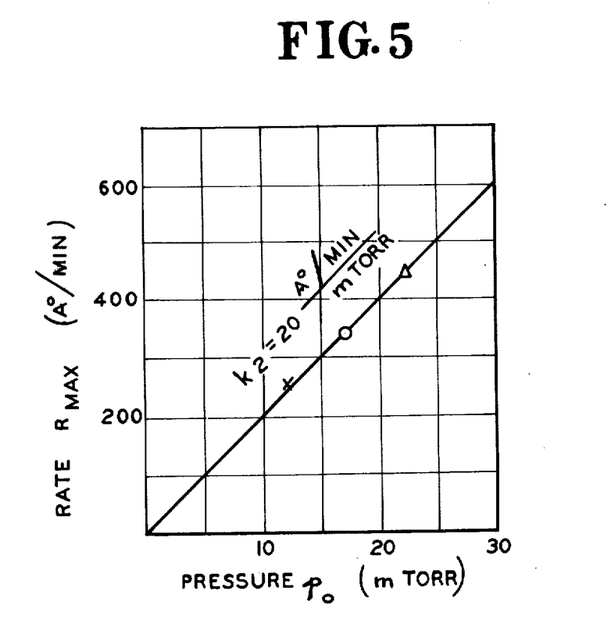
FIG. 5 is a graph showing the maximum deposition rate as a function of the partial pressure of styrene in the chamber when a glow is not present.

FIG. 5 is a graph of the maximum deposition rate $R_{max}$ observed at high powers as a function of the $P_o$, the no glow styrene pressure in the system. FIG. 5 indicates that at high powers the maximum deposition rate is approximately $k_2 P$ where the constant $k_2 = 20$ (A/min)/mT. Other data indicate that this relationship applies to values of $P_o$ up to 80 mT for which deposition rates greater that 1,400 A/min were observed.

The coating apparatus has been operated continuously for over 100 hr with no apparent deleterious effects on the coatings produced. In this life test nitrogen and styrene were introduced into the chamber at rates sufficient to maintain the total operating pressure between 13 and 18 mT. The partial pressure of nitrogen was approximately 7.5 mT. The current was maintained at 2.2 A and the potential was about 900 V. The deposition rate for a total pressure of 15 mT was measured periodically and found to remain substantially constant at 1500 A/min.

EXAMPLES

Many polystyrene layers have been prepared under a wide variety of conditions. Only two illustrative examples will be mentioned. For the first example 83-27-RC, the starting gas was styrene which was maintained at a pressure 6.8 mT. No ionizable inert gas was introduced into the chamber. A coating 0.35 μm thick was deposited on a glass slide in 15 min. with a peak power of 28 W. The peak current was 50 mA and the peak potential was 555 V at 9.7 kHz.

In the second example 105-8, a pressure of 4 mT of nitrogen was established in the chamber and styrene was admitted to maintain the total pressure at 8.2 mT. The substrate was a piece of plastic which had been coated with about 300 A of copper. A polystyrene coating of about 350 A was deposited in 1 min. The power was 2.3 kW, the current was 2.6 A, and the potential about 900 V at 10 kHz.

The method and apparatus of the invention are not limited to the formation of polystyrene coatings. Layers of Teflon PTFE have been prepared using tetrafluorethylene as a starting gas. To prepare these films, a partial pressure of 10 mT of nitrogen and a no glow of pressure of 15 mT of starting gas were introduced into the chamber. When the glow discharge was established, the system pressure dropped to 25 mT. A coating of thickness 700 A was deposited on a glass slide in 30 min. A layer of thickness 400 A was deposited on a metal coated glass slide in 30 min. For both examples the glow discharge power was 1.1 kW, the current was 1.2 A, and the potential was about 900 V at 9.7 kHz.

In certain applications, it is desirable to prepare a layer of a polymer which is doped to a particular concentration with another material. Such doping can alter the dielectric constant, electrical conductivity and other properties of the layer. In many cases the dopant material can be used as a sputtering electrode. The power required for the desired sputtering rate will depend upon the sputtering yield of the dopant material. The pressure of the starting gas in the chamber can also be varied to change the relative amounts of dopant and polymerized material which deposit on the substrate. A gradient in the dopant concentration can be obtained by varying the relative deposition rates as the layer forms.

What is claimed is:

1. A method of coating a substrate with a layer of a polymeric material, which comprises:
    placing the substrate, a first electrode and a second electrode in a chamber which can be evacuated;
    introducing into the chamber a gaseous polymerizable substance;

establishing a glow discharge in the chamber to deposit material comprising said polymerizable substance on the first electrode and the substrate;

confining the glow discharge to a region adjacent to the first electrode; and applying an electric potential across the first and second electrodes so that material deposited on the first electrode is sputtered and redeposited on the substrate where a polymerized coating forms.

2. A method according to claim 1 wherein the glow discharge is confined magnetically.

3. A method according to claim 2 in which the glow discharge is confined by magnetic flux lines which emerge from the first electrode, arc into the space adjacent to the first electrode and re-enter the first electrode.

4. A method according to claim 3 in which an alternating electric potential is applied across the first and second electrodes.

5. A method according to claim 4 in which the total pressure in the chamber is less than 100 millitorr.

6. A method according to claim 5, further comprising:

introducing an ionizable inert gas into the chamber.

7. A method of coating a substrate with a polymer which comprises:

placing the substrate, a first electrode and a second electrode in a chamber which can be evacuated;

maintaining a gaseous polymerizable substance in the space between the first and second electrodes at a partial pressure which is less than 100 millitorr;

applying an alternating electric potential across the first and second electrodes to establish a glow discharge plasma;

confining the glow discharge plasma to a region adjacent to the first electrode; and simultaneously sputtering material comprising said polymerizable substance deposited on the first electrode and redepositing a portion of the sputtered material on the substrate where a polymerized coating forms.

8. A method according to claim 7 wherein the glow discharge plasma is confined to an annular region adjacent to the first electrode by a magnetic field having lines of flux which emerge from the first electrode, arc into the space adjacent to the first electrode and re-enter the first electrode.

9. A method according to claim 8 in which the electric potential alternates at a frequency which is greater than 3 kHz and less than 60 kHz.

10. A method according to claim 9 in which the polymerizable gas is styrene.

11. A method of coating a substrate with a layer of polymeric material which is doped with a material which is capable of being sputtered, comprising:

placing a first electrode made from the dopant material, a second electrode and the substrate in a chamber which can be evacuated;

introducing into the chamber a gaseous polymerizable substance;

establishing a glow discharge in the chamber to deposit material comprising said polymerizable substance on the first electrode and the substrate;

confining the glow discharge to a region adjacent to the first electrode; and applying an electric potential across the first and second electrodes so that material deposited on the first electrode and the electrode material itself are sputtered and deposited on the substrate where a polymerized coating forms.

12. A method as claim 11 wherein the glow discharge is confined to an annular region adjacent to the first electrode by magnetic flux lines which emerge from the first electrode, arc into the space adjacent to the first electrode and re-enter the first electrode.

13. A method according to claim 12 in which the glow discharge is established by an alternating electric potential applied across the first and second electrodes.

* * * * *